United States Patent [19]

Okano

[11] Patent Number: 5,329,093
[45] Date of Patent: Jul. 12, 1994

[54] BURN-IN APPARATUS FOR SEMICONDUCTOR INTEGRATED DEVICE

[75] Inventor: Nobuhiro Okano, Nara, Japan

[73] Assignee: Sharp Kabushiki Kaisha, Osaka, Japan

[21] Appl. No.: 911,687

[22] Filed: Jul. 13, 1992

[30] Foreign Application Priority Data

Aug. 29, 1991 [JP] Japan .................................. 3-218743

[51] Int. Cl.⁵ .............................................. H05B 1/00
[52] U.S. Cl. ...................................... 219/209; 324/537
[58] Field of Search ...................... 219/209; 324/158 F

[56] References Cited

U.S. PATENT DOCUMENTS

| | | | |
|---|---|---|---|
| 4,777,434 | 10/1988 | Miller et al. | 324/158 F |
| 4,926,117 | 5/1990 | Nevill | 324/158 F |
| 4,978,914 | 12/1990 | Akimoto et al. | 324/158 F |
| 5,126,656 | 6/1992 | Jones | 324/158 F |
| 5,180,974 | 1/1993 | Mitchell et al. | 324/158 F |
| 5,200,885 | 4/1993 | Hamilton et al. | 324/158 F |

*Primary Examiner*—Reynolds Bruce A.
*Assistant Examiner*—Gregory L. Mills
*Attorney, Agent, or Firm*—Nixon & Vanderhye

[57] ABSTRACT

The burn-in apparatus according to the present invention comprises a fixing unit for accommodating and fixing a plurality of semiconductor integrated devices and a unit for accommodating the fixing unit with the devices so as to keep a thermal condition therein. The fixing unit and the unit for accommodating the fixing unit are combined as one body to be carryable. The apparatus further comprises a unit for connecting the semiconductor integrated devices with a power supply disposed outside of the apparatus. When a burn-in test is conducted, the fixing unit and the unit for accommodating the fixing unit are combined as one body, and this combined body is fitted with a connector. After the burn-in test is finished, by detaching the unit for accommodating the fixing unit, the fixing unit can be used as trays for conveying the devices to the next test process.

12 Claims, 2 Drawing Sheets

BURN-IN APPARATUS FOR SEMICONDUCTOR INTEGRATED DEVICE

BACKGROUND OF THE INVENTION

1. Field of the Invention

The present invention relates to a burn-in apparatus for operation of semiconductor integrated devices under normal or extreme condition, prior to actual use.

2. Description of the Related Art

In order to assure the quality and reliability of semiconductor integrated device, it is absolutely necessary to conduct a so-called burn-in, which is a screening test under high temperature in order to stabilize its characteristics and eliminate early failures, before shipment. The burn-in system can be classified into the following three types according to the operating condition of a semiconductor integrated device under test.

a. Static burn-in system: there is provided with a pyrostat and a DC power supply, and a constant voltage is applied to the semiconductor integrated devices in the pyrostat from the DC power supply.

b. Dynamic burn-in system: the dynamic system further comprises a pulse generator for imitating an operation of the device under actual use. A constant voltage is applied to the devices in the pyrostat from the DC power supply and a signal close to an actual operating state is input to the semiconductor integrated devices from the pulse generator.

c. Monitored burn-in system: the system has a monitoring function for measuring continuously or at intervals output signals from the semiconductor integrated devices in a dynamic burn-in, and then an accept-reject decision is made to eliminate devices with a defect during the burn-in.

In such a burn-in system, there is provided with a plurality of burn-in boards each having a connector for connecting with the DC power supply, the pulse generator or a monitor unit. A plurality of semiconductor integrated devices are accommodated in the sockets respectively, and the burn-in boards each having a plurality of semiconductor integrated devices are accommodated in the pyrostat for setting specified temperature and environmental conditions. For the monitored burn-in system, it is necessary to additionally provide a comparing and decision-making test device for making a pass-reject decision.

With the increasing number of pins, the progressing integration and the growing capability of the semiconductor integrated devices, the use of higher-function larger-scale burn-in equipment has become widespread and the investment in equipment for burn-in processes has been on the steady increase. Meanwhile, the trend toward the low-volume greater-variety production has been strengthened in recent years, and therefore, it is necessary to have various kinds of burn-in equipment to be ready for production of various types of semiconductor integrated devices. Above all, it is required to make ready a large variety of pyrostats so as to be meet different setting conditions for different types. The growing storage space and cost of the pyrostats have become no small problem.

SUMMARY OF THE INVENTION

It is therefore an object of the present invention to provide a burn-in apparatus which does not require a variety of large-size pyrostats that have heretofore been procured for different setting conditions and that have occupied a large space for storage.

The burn-in apparatus according to the present invention comprises a fixing unit for accommodating and fixing a plurality of semiconductor integrated devices and a unit for accommodating the fixing unit with the devices so as to keep a thermal condition therein. The fixing unit and the unit for accommodating the fixing unit are combined as one body to be carryable. The apparatus further comprises a unit for connecting the semiconductor integrated devices with a power supply disposed outside of the apparatus.

When a burn-in test is conducted, semiconductor integrated devices under test are mounted on the fixing unit dedicated to burn-in, and the fixing unit is combined as one body with the unit for accommodating the fixing unit. A connector may be attached to the combined body, and through the connector, a supply voltage and input signals are supplied to the semiconductor integrated devices via the connecting unit and a voltage is supplied to a heater installed inside the unit for accommodating the fixing unit. Therefore, the need to provide large-size pyrostats can be obviated, so that the storage space for the testing equipment and the investment in equipment can be reduced.

In addition, the unit for accommodating the fixing unit can be used as trays for conveying the devices to the next test process, and therefore, trouble to move the devices into trays can be avoided.

Further objects and advantages of the present invention will be apparent from the following description of the preferred embodiments of the invention as illustrated in the accompanying drawings.

DESCRIPTION OF THE DRAWINGS

FIG. 4 is a view of a burn-in apparatus according to the present invention connected to a connector for connecting to a DC power supply or the like.

DESCRIPTION OF THE PREFERRED EMBODIMENTS

Description will now be made of preferred embodiments of the present invention.

Figure 1:
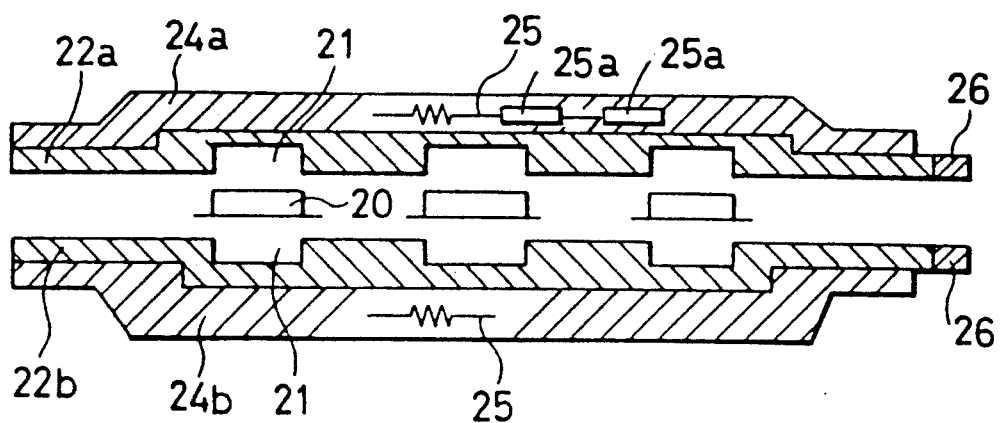
FIG. 1 is a schematic sectional view of a first embodiment of a burn-in apparatus for semiconductor integrated devices according to the present invention.

FIG. 1 shows an embodiment of the burn-in apparatus for semiconductor integrated devices according to the present invention. The burn-in apparatus comprises a pyrostat including a first portion 24a as an upper lid and a second portion 24b as a bottom base. A set of burn-in boards 22a and 22b are mounted in the pyrostat 24a, 24b and is provided with a plurality of sockets 21 in which semiconductor integrated devices 20 are accommodated respectively. The first and second portions 24a, 24b are provided with heaters 25 within, respectively, and the temperature in the pyrostat 24 is kept by sensing the temperature and by controlling the heaters 25.

The pyrostat is provided with a sensor 25a for detecting a temperature therein. Preferably, a controller 25b is provided in the pyrostat for controlling the temperature by use of the sensor.

Figure 4:
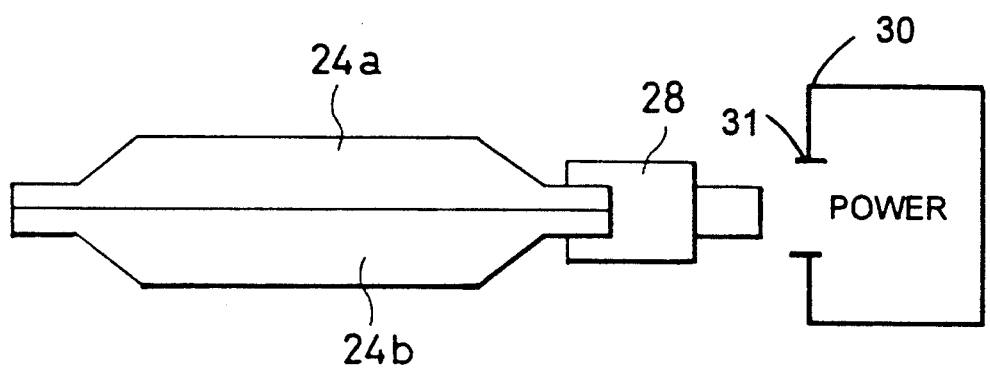

A connector 26 is disposed at each end of the burn-in boards 22a, 22b so as to project from the pyrostat 24 in order to connect the accommodated semiconductor devices with a DC power supply 30 and a heater power supply 30, shown in FIG. 4. A pulse generator can be connected through the connectors 26 as occasion demands. Conductors, such as sockets 21, for connecting the semiconductor devices with the connectors 26 are disposed within the burn-in boards 22a, 22b according to the type of the semiconductor integrated device 20. The connectors 26 are connected to a corresponding connector 31 and a DC power and a heater power are applied to all the devices 20 in the pyrostat 24 via these connectors. In the case of a monitored burn-in test, the connectors is adopted to be connected with a unit for monitoring output signals from the devices under extreme conditions.

The pyrostat can be used in common irrespective of the type of the semiconductor device 20. On the other hand a plurality of burn-in boards are provided according to the number of types of semiconductor devices. Therefore, this embodiment of the burn-in apparatus is suitable for the purpose of burn-in test for the low-volume greater-variety production.

Figure 2:
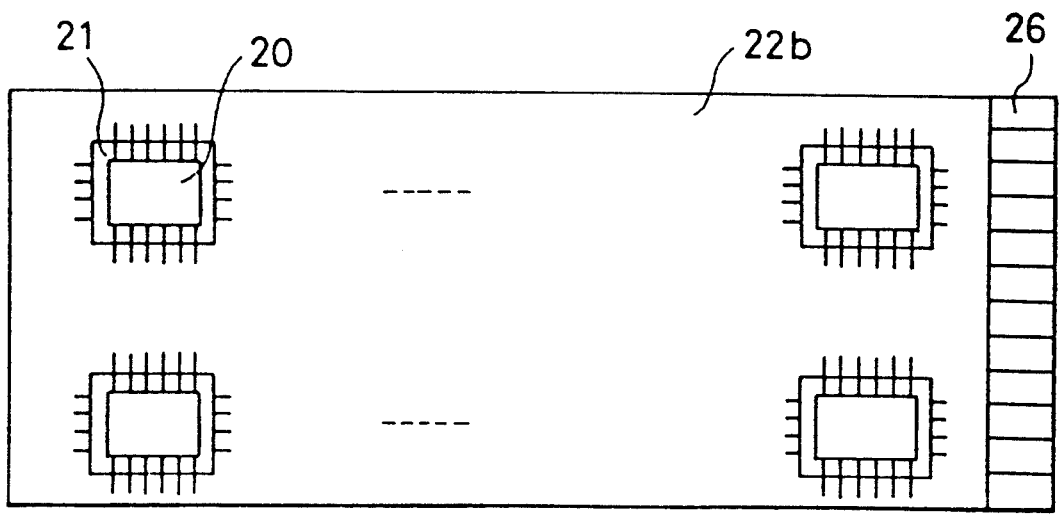
FIG. 2 is a schematic plan view of a burn-in board of the burn-in apparatus for semiconductor integrated device of FIG. 1.

FIG. 2 is a plan view of the burn-in board 22b. In the burn-in apparatus according to this embodiment, each board and the sockets 21 are formed as an inseparable body. Each semiconductor integrated device 20 is placed in the respective socket 21 and sandwiched in between the burn-in board 22b and the upper burn-in board 22a (not shown in FIG. 2).

The upper and lower boards can be used as a tray. Therefore, after the burn-in is finished, by detaching the set of the boards from the pyrostat, the boards can be sent to the subsequent test process without transferring the devices to another tray.

Figure 3:
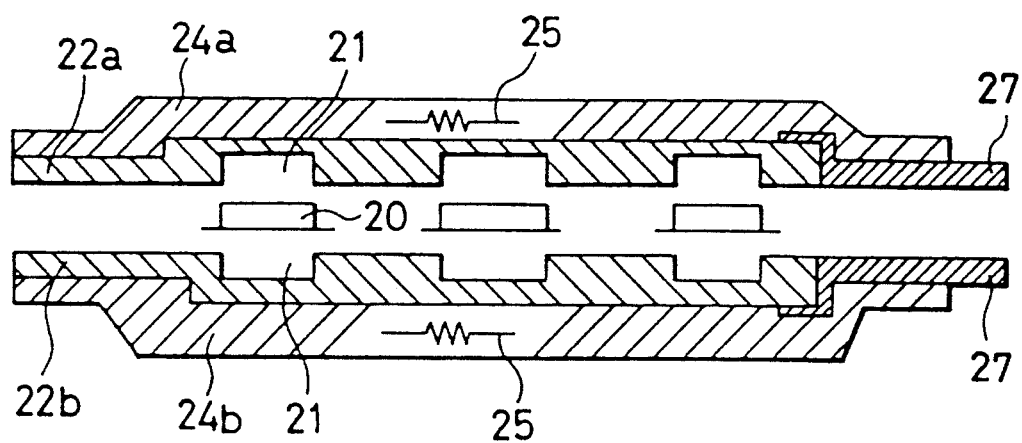
FIG. 3 is a schematic sectional view of a second embodiment of a burn-in apparatus for semiconductor integrated devices according to the present invention.

FIG. 3 shows a second embodiment of the present invention. The burn-in apparatus according to the first embodiment comprises the burn-in boards having connectors, but the burn-in apparatus comprises connector portions 27 disposed at each end part of the first portion 24a and the second portion 24b of the pyrostat. The connector portions 27 engages with the burn-in boards 22a, 22b to connect the semiconductor integrated devices 20 with a DC power supply or the like when the boards 22a and 22b are mounted within the pyrostat.

Description will now be described of the procedure of the burn-in process using the above-mentioned embodiments. Devices under burn-in test are mounted in the sockets 21 of the upper and lower burn-in boards used exclusively for that type of devices, and the upper and lower boards 22a, 22b are put together and fixed, and the set of burn-in boards is fitted with the heater-built-in pyrostat to form a combined body.

As shown in FIG. 4, the upper and lower halves of the burn-in apparatus are put together and fixed, and then a connector 28 is attached to the projection part of the portions 24a, 24b of the pyrostat after semiconductor devices to be subjected to a burn-in test are mounted.

Under this condition, a DC power supply and a heater power supply are connected through the connector 28, input signals are supplied through the connector 28 to the devices at need, and a static burn-in, a dynamic burn-in or a monitored burn-in is performed. After the burn-in process is finished, the pyrostat portions 24a and 24b of the pyrostat are detached, and the boards are sent with the devices remaining mounted thereon used as a tray to the next test process.

Many widely embodiments of the present invention may be constructed without departing from the spirit and the scope of the present invention is not limited to the specific embodiments described in the specification, except as defined in the appended claims.

What is claimed is:

1. A portable burn-in apparatus for testing electronic components comprising:
   first and second boards each having a plurality of sockets that receive the electronic components, each electronic component being sandwiched between an opposing pair of sockets wherein one socket of said pair of sockets is one of said plurality of sockets in said first board and a second socket of said pair of sockets is one of said plurality of sockets in said second board;
   accommodating means for accommodating said boards with the electronic components to maintain said electronic components in a predetermined thermal condition, said accommodating means includes first and second portions each having a heater, and said boards being within said first and second portions; and
   connection means for connecting said electronic components to a power supply.

2. A portable burn-in apparatus according to claim 1, wherein said accommodating means further comprises a sensor for detecting a temperature in said apparatus and a controller for controlling the heaters to maintain said plurality of electronic components at a constant the temperature.

3. A portable burn-in apparatus according to claim 1 or 8, wherein said connection means includes conductors disposed in at least one of said first and second boards and connected to the electronic components, and a connector exposed to an outside of said accommodating means for connecting said conductors with the power supply.

4. A portable burn-in apparatus according to claim 1, wherein said apparatus further comprises a power connector for engaging with said connection means to supply a power from the power supply.

5. A portable burn-in apparatus for testing electronic components comprising:
   first and second boards having a plurality of sockets each that receive said electronic components, said boards together being a tray for said electronic components after a burn-in test is completed, each electronic component in said sockets being sandwiched between said first and second boards;
   first and second accommodating members each having a heater therein for accommodating said first and second boards with the electronic components to keep a thermal condition therein; and
   connection means for connecting said electronic components with a power supply.

6. A portable burn-in apparatus according to claim 5, wherein each accommodating member further comprises a sensor for detecting a temperature therein and a controller for controlling the heater to keep the temperature constant.

7. A portable burn-in apparatus according to claim 5 or 6, wherein said connecting means includes conductors disposed in at least one of said first and second boards and connected to the electronic components, and a connector exposed to an outside of said accommodating members for connecting said conductors with the power supply.

8. A portable burn-in apparatus according to claim 7, wherein said apparatus further comprises a power connector for engaging with said connector to supply a power from the power supply.

9. A portable burn-in apparatus for testing electronic components comprising:
first and second boards each having a plurality of sockets for said electronic components, each electronic component being sandwiched between a first socket in said first board and a second socket in said second board, said first and second boards in cooperation forming a tray for said electronic components after a burn-in test is completed;
a first and a second accommodating members each having a heater for said first and second boards to maintain a thermal condition in said boards, and inner surfaces of said accommodating members abut outer surfaces of said boards; and
connection means for connecting said electronic components with a power supply.

10. A portable burn-in apparatus according to claim 9, wherein each accommodating member further comprises a sensor for detecting a temperature in said apparatus and a temperature controller for controlling the heater to maintain a constant temperature in said apparatus.

11. A portable burn-in apparatus according to claim 9 or 10, wherein said connection means includes conductors disposed in at least one of said first and second boards and said conductors being connected to the electronic components, and a connector exposed to an outside power contact of said accommodating members for connecting said conductors with the power supply.

12. A portable burn-in apparatus according to claim 11, wherein said apparatus further comprises a power connector for engaging said connector to supply a power from the power supply to said apparatus.

* * * * *